(12) United States Patent  (10) Patent No.: US 8,055,489 B2
Makhratchev et al.  (45) Date of Patent: Nov. 8, 2011

(54) METHOD FOR USING AN RC CIRCUIT TO MODEL TRAPPED CHARGE IN AN ELECTROSTATIC CHUCK

(75) Inventors: Konstantin Makhratchev, Fremont, CA (US); Brian McMillin, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 348 days.

(21) Appl. No.: 12/333,935

(22) Filed: Dec. 12, 2008

(65) Prior Publication Data

US 2010/0085679 A1   Apr. 8, 2010

Related U.S. Application Data

(60) Provisional application No. 61/013,596, filed on Dec. 13, 2007.

(51) Int. Cl.
   *G06G 7/48* (2006.01)
(52) U.S. Cl. .......................................................... 703/7
(58) Field of Classification Search ........................ 703/7
   See application file for complete search history.

(56) References Cited

U.S. PATENT DOCUMENTS

| | | | |
|---|---|---|---|
| 5,600,578 A | * | 2/1997 | Fang et al. .................... 703/14 |
| 6,475,351 B2 | | 11/2002 | Sun et al. |
| 7,685,543 B2 | * | 3/2010 | Tsuji et al. .................... 716/106 |

FOREIGN PATENT DOCUMENTS

| | | |
|---|---|---|
| JP | 2001210706 A2 | 8/2001 |
| JP | 2007505504 T2 | 3/2007 |
| KR | 100708237 B1 | 4/2007 |
| KR | 100749169 B1 | 8/2007 |
| WO | WO-2009078949 A2 | 6/2009 |
| WO | WO-2009078949 A3 | 6/2009 |

OTHER PUBLICATIONS

"International Application Serial No. PCT/US2008/013635, Search Report mailed Jul. 27, 2009", 4 pgs.
"International Application Serial No. PCT/US2008/013635, Written Opinion mailed Jul. 27, 2009", 3 pgs.
"International Application Serial No. PCT/US2008/013635, International Preliminary Report on Patentability mailed Apr. 14, 2010", 17 pgs.

* cited by examiner

*Primary Examiner* — Dwin M Craig
(74) *Attorney, Agent, or Firm* — Schwegman, Lundberg & Woessner, P.A.

(57) ABSTRACT

A method for simulating the effect of trapped charge in an electrostatic chuck on the chuck performance comprises creating a trapped-charge electrical model having a trapped-charge capacitor and a gap-trapped resistor, and coupling the model to a plurality of voltage sources. The trapped-charge capacitor and the gap-trapped resistor may be varied in relation to a plurality of electrostatic chuck physical parameters.

17 Claims, 4 Drawing Sheets

METHOD FOR USING AN RC CIRCUIT TO MODEL TRAPPED CHARGE IN AN ELECTROSTATIC CHUCK

CROSS-REFERENCE TO RELATED APPLICATIONS

This application claims the benefit of U.S. Provisional Application Ser. No. 61/013,596 filed Dec. 13, 2007 and entitled "Method For Using an RC Circuit to Model Trapped Charge in an Electrostatic Chuck," the content of which is incorporated by reference herein in its entirety.

TECHNICAL FIELD

The present invention is related to the design and simulation of an electrostatic chuck, commonly employed in semiconductor processing equipment for holding a substrate. More specifically, the present invention provides an improved method and model for the simulation of trapped charge in an electrostatic chuck in order to estimate effects of trapped charge on chuck performance. By application of the model and simulation method, the effects of specific operating parameters such as effective clamp voltage and leakage current, can be determined, enabling the design of an electrostatic chuck having desirable operating characteristics.

BACKGROUND ART

Electrostatic chucks are increasingly employed in semiconductor processing equipment as a means for holding a substrate, such as a silicon wafer, in position while undergoing a fabrication process. Skilled artisans will appreciate that electrostatic chucks have a variety of benefits such as an ability to hold a substrate securely in a vacuum chamber where conventional vacuum chucks are inappropriate. An electrostatic chuck can retain a wafer without a need for mechanical retention devices like clips, which can interfere with process conditions, damage the wafer surface, or exclude a portion of the wafer surface from receiving a desired process treatment.

Electrostatic chucks operate by inducing opposing charges on the substrate and the chuck resulting in an electrostatic attraction between the chuck and the substrate. The degree of attraction is dependent on an amount of charge induced as well as a rate at which the charge dissipates due to conductive effects. Voltage biasing is employed to induce and control the electrostatic force and may be applied for only a portion of a processing cycle, e.g., just after a substrate is transferred to the chuck. Alternately, voltage biasing may be applied continuously throughout a processing cycle. For example, using the conduction properties of a plasma can provide a means of electrical connection to one terminal of a substrate and wafer system.

The design and simulation of an electrostatic chuck requires an estimation of several parameters. In particular, the amount of charge which is accumulated between the substrate and the chuck is an important parameter. This charge, known as gap charge, is retained in regions where the substrate and the chuck are not in physical contact. Another important parameter is the electrical resistance between the substrate and the chuck. This resistance, known as gap resistance, is associated with numerous points of contact between the chuck and the substrate. (Skilled artisans will appreciate surface roughness present on both the substrate and the chuck produces a microscopic chuck/substrate interface having many discrete points of physical connection in association with numerous gaps, despite a macroscopic appearance of direct contact.) The gap charge is directly related to the attractive force between the chuck and the substrate, while the gap resistance determines how quickly the attractive force diminishes with time if not maintained by a voltage bias.

When applying a bias to the substrate/chuck system, the gap charge will be affected by charge which is trapped in the chuck itself. This trapped charge is determined by the physical design of the electrostatic chuck in addition to its chemical composition. The trapped charge will further be determined by electrical characteristics of the chuck. In particular, ceramics commonly used by skilled artisans for electrostatic chucks have a grain structure which can provide a resistive path for electrical conduction through the chuck. Additionally, a gap-trapped resistance between the chuck and the substrate can provide an electrical path for trapped charge in the chuck to pass into or out of the substrate according to voltage bias conditions. Finally, the substrate itself will possess a resistance which can affect the charge distribution and time-varying characteristics of the substrate/chuck system.

The design and simulation of electrostatic chucks typically involves the use of experimentally determined values for key design parameters, in particular for the measurements of the charge trapped in the chuck (which will be referred to herein as $C_{trapped}$). In order to model the performance of a chuck having altered design parameters, for example, a different area, new measurements are typically made on a physical system. Furthermore, trade publications and technical articles typically employ simple electrical models for the apparatus used to bias the chuck. These models are usually based on a single constant voltage source and on/off switch with only two resistors and two capacitors.

What is needed is an improved means for electrically modeling the trapped charge in an electrostatic chuck and a method for simulating the effect of trapped charge on electrical parameters which relate to desirable performance characteristics of the chuck such as adhesive force.

SUMMARY OF THE INVENTION

These needs have been met in the present invention which presents a method and an apparatus for modeling the trapped charge in an electrostatic chuck by means of a combination of resistance and capacitance values. This combination, known as an RC model, is employed in a circuit which incorporates other electrical models relevant to the electrostatic chuck performance (e.g., a resistance value associated with the substrate). The circuit behavior is then simulated with a circuit simulator which further incorporates controls for various voltage sources representative of the conditions used in actual operation of the electrostatic chuck in semiconductor processing equipment. The circuit simulation may also be used as a means for enabling the construction of an electrostatic chuck and associated control apparatus for use in processing equipment.

In an exemplary embodiment, the present invention is a method of using a circuit simulator to simulate an effect of trapped charge in an electrostatic chuck on the electrostatic chuck performance. The method includes creating a trapped-charge electrical model by coupling a trapped charge capacitor to a gap-trapped resistor, and to a grain resistor; selecting a capacitance value $C_{trapped}$ for the trapped charge capacitor; selecting a resistance value $R_{gap-trapped}$ for the gap-trapped resistor; selecting a resistance $R_{grain}$ for the grain resistor; creating an electrostatic chuck simulation circuit by coupling a substrate-to-chuck interface gap capacitor with a substrate-to-chuck interface gap resistor, a substrate resistor, at least one cable resistor, and a plurality of voltage sources; configuring at least one of the plurality of voltage sources to provide a time-varying voltage; coupling the trapped-charge electrical model with the electrostatic chuck simulation circuit; and executing a first simulation in the circuit simulator to determine time-varying voltage and currents responses within a plurality of circuit nodes in the electrostatic chuck simulation circuit.

In another exemplary embodiment, the present invention is a circuit to measure an effect of trapped charge in an electrostatic chuck system on the chuck performance. The circuit includes an electrostatic chuck circuit portion having a substrate-to-chuck interface gap capacitance $C_{gap}$ coupled to a substrate-to-chuck interface gap resistance $R_{gap}$, a substrate resistance $R_{wafer}$, at least one cable resistance $R_{cable}$, and a trapped-charge circuit portion having a capacitance $C_{trapped}$, a resistance $R_{gap\text{-}trapped}$ and a resistance $R_{grain}$. The circuit further includes a plurality of voltage sources where at least one of the plurality of voltage sources is capable of varying a voltage output as a function of time with the plurality of voltage sources coupled to the electrostatic chuck circuit portion.

In another exemplary embodiment, the present invention is a method of designing an electrostatic chuck. The method includes building in a circuit simulator a circuit model for the electrical behavior of the electrostatic chuck using an RC trapped-charge model; coupling the circuit model to a plurality of voltage sources; simulating the circuit model with the circuit simulator to determine voltage potentials at a plurality of circuit nodes and further to determine currents within a plurality of circuit components; varying the circuit model in relation to changes in physical parameters of the electrostatic chuck; and simulating the circuit with the circuit simulator to determine changes produced by varying the circuit model.

In another exemplary embodiment, the present invention is a system for controlling an electrostatic chuck. The system includes a voltage-controlled voltage source means for providing a time-varying bias to the electrostatic chuck in proportion to a time-varying controlling voltage, the time-varying bias for controlling a substrate to chuck adhesion according to simulation results from a charge-trapped circuit model; a time-varying voltage means for providing the time-varying controlling voltage; a dc bias means for applying a dc bias to the electrostatic chuck; and a cable means coupling the electrostatic chuck, the voltage-controlled voltage source means, the time-varying voltage source means, and the dc bias means.

DETAILED DESCRIPTION OF THE INVENTION

Figure 1:
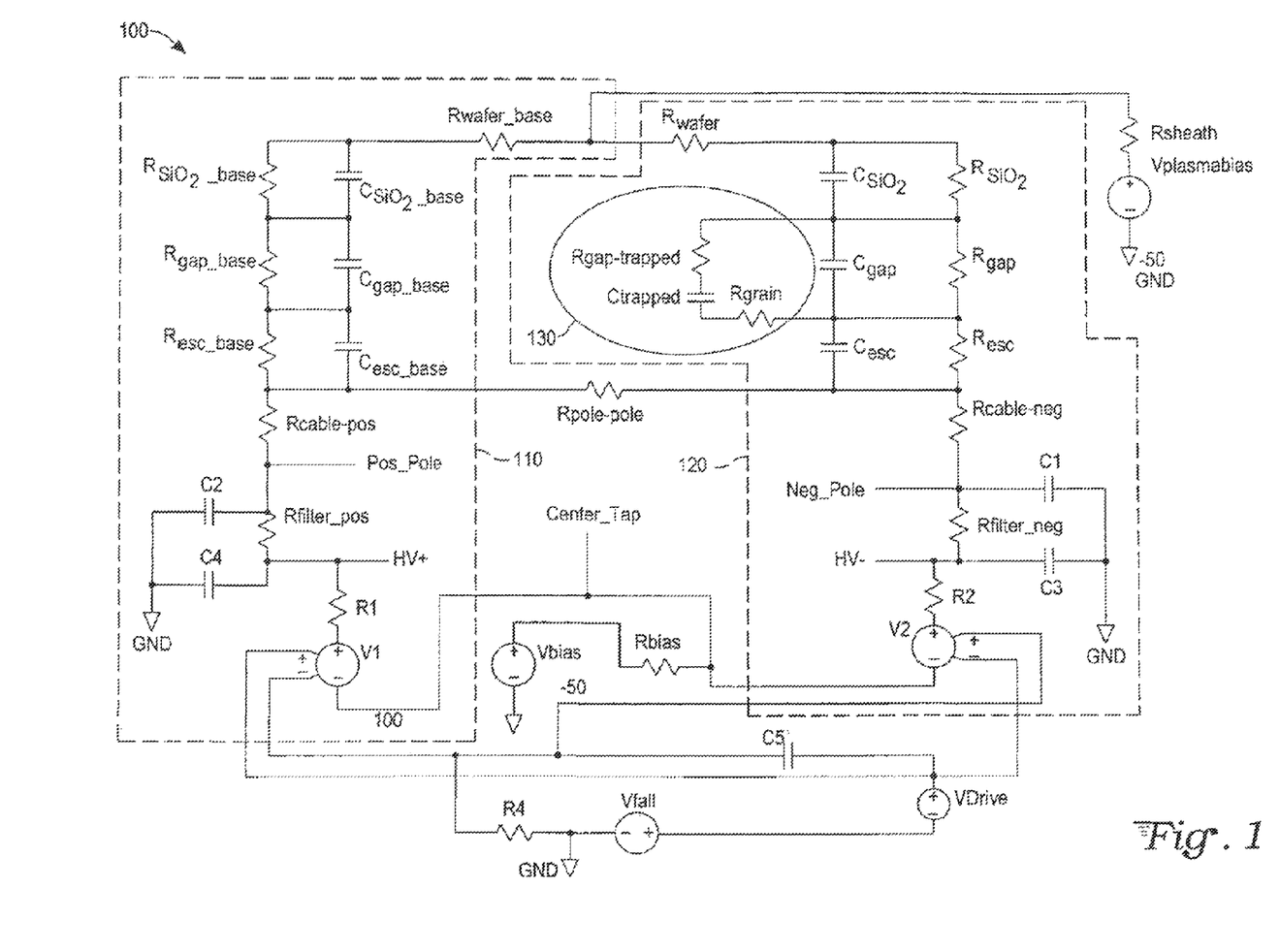
FIG. 1 is circuit schematic of an exemplary electrostatic chuck system used to model the performance of an electrostatic chuck within an apparatus for semiconductor processing.

With reference to FIG. 1, an exemplary embodiment of the present invention comprises an electrostatic chuck system 100 having a baseline circuit portion 110 and a modified circuit portion 120. The baseline simulation portion 110 is used to provide a circuit simulation of an electrostatic chuck without the influence of trapped charge. The modified circuit portion 120 includes a trapped charge RC model 130 which enables the influence of trapped charge on the electrostatic chuck performance to be determined, by methods to be explained below. The trapped charge RC model 130 includes a resistor $R_{gap\text{-}trapped}$, a capacitor $C_{trapped}$, and a resistor $R_{grain}$.

Attention is directed back to the baseline circuit portion 110 which includes resistors $R_{wafer\_base}$, $R_{SiO2\_base}$, $R_{gap\_base}$, $R_{esc\_base}$, $R_{cable\_pos}$, $R_{filter\_pos}$, and R1. The baseline circuit portion 110 further includes a voltage-controlled voltage source V1 and capacitors $C_{SiO2\_base}$, $C_{gap\_base}$, $C_{esc\_base}$, C2, and C4. In the notations for the capacitor and resistor circuit elements comprising the baseline circuit portion 110, the subscripted suffix "_base" is intended to identify that the circuit element is associated with a baseline case, i.e., the operation or simulation of an electrostatic chuck where the effects of trapped charge are ignored. In the discussion of the modified circuit portion 120, circuit elements will be introduced which have analogous functions, and are identified by corresponding names without the "_base" notation.

A first terminal of the resistor $R_{wafer\_base}$ is coupled to a first terminal of the resistor $R_{SiO2\_base}$ and to a first terminal of a capacitor $C_{SiO2\_base}$. The resistor $R_{SiO2\_base}$ simulates a resistance of a native oxide on a substrate on the electrostatic chuck. For this exemplary embodiment, $R_{SiO2\_base}$ corresponds to resistance of native $SiO_2$ (silicon dioxide) on a silicon wafer, and the capacitor $C_{SiO2\_base}$ corresponds to the capacitance of a layer of native $SiO_2$ which forms spontaneously on a silicon surface. A second terminal of the resistor $R_{wafer\_base}$ is coupled to a first terminal of a resistor $R_{wafer}$ and to a first terminal of a resistor $R_{sheath}$. The resistor $R_{wafer\_base}$ simulates a bulk resistance of a substrate on the electrostatic chuck. A second terminal of the resisto $R_{SiO2\_base}$ is coupled to a second terminal of the capacitor $C_{SiO2\_base}$, to a first terminal of the resistor $R_{gap\_base}$, and to a first terminal of the capacitor $C_{gap\_base}$. A second terminal of the resistor $R_{gap\_base}$ is coupled to a second terminal of the capacitor $C_{gap\_base}$, to a first terminal of the resistor $R_{esc\_base}$, and to the first terminal of a capacitor $C_{esc\_base}$. The resistor $R_{gap\_base}$ and the capacitor $C_{gap\_base}$ model the electrical characteristics of an interface between the semiconductor wafer and an electrostatic chuck surface. In particular, the resistor $R_{gap\_base}$ is related to the electrical conductance associated with points of mechanical contact between the semiconductor wafer and the electrostatic chuck surface. The capacitor $C_{gap\_base}$ is related to regions of separation between the semiconductor wafer and the electrostatic chuck surface. The resistor $R_{esc\_base}$ models a bulk resistance of an electrostatic chuck; the capacitor $C_{esc\_base}$ models a bulk capacitance of the electrostatic chuck.

A second terminal of the resistor $R_{esc\_base}$ is coupled to a second terminal of the capacitor $C_{esc\_base}$, to a first terminal of a resistor $R_{cable\text{-}pos}$ and to a first terminal of a resistor $R_{pole\text{-}pole}$. The resistor $R_{pole\text{-}pole}$ models parasitic leakage in the bulk of the electrostatic chuck material.

Attention is now directed to the modified circuit portion 120 which includes resistors $R_{wafer}$, $R_{SiO2}$, $R_{gap}$, $R_{esc}$, $R_{cable}$, $R_{filter}$, and R2. The modified circuit portion 120 further includes a voltage-controlled voltage source V2 and capacitors $C_{SiO2}$, $C_{gap}$, $C_{esc}$, C1, and C3. With continued reference to the trapped charge RC model 130, a first terminal of the resistor $R_{gap\text{-}trapped}$ is coup led to a first terminal of the capacitor $C_{gap}$. A second terminal of resistor $R_{gap\text{-}trapped}$ is coupled to a first terminal of the capacitor $C_{trapped}$. A second terminal of the capacitor $C_{trapped}$ is coupled to a first terminal of the resistor $R_{grain}$. A second terminal of the resistor $R_{grain}$ is coupled to a second terminal of the capacitor $C_{gap}$. A first terminal of the capacitor $C_{esc}$ is coupled to a first terminal of the resistor $R_{esc}$, and to the second terminal of the capacitor $C_{gap}$. A first terminal of the resistor $R_{gap}$ is coupled to the first terminal of the capacitor $C_{gap}$ and to the first terminal of the resistor $R_{gap\text{-}trapped}$. A second terminal of the resistor $R_{gap}$ is coupled to the second terminal of the capacitor $C_{gap}$ and to the second terminal of the resistor $R_{grain}$. The capacitor $C_{SiO2}$ has a first terminal coupled to the resistor $R_{wafer}$ and to a first terminal of the resistor $R_{SiO2}$. The capacitor $C_{SiO2}$ further has a second terminal coupled to the first terminal of the resistor $R_{gap\text{-}trapped}$ and to the first terminal of the capacitor $C_{gap}$. A second terminal of the resistor $R_{SiO2}$ is coupled to the second terminal of the capacitor $C_{SiO2}$. A first terminal of the resistor $R_{wafer\text{-}base}$ is coupled to a resistor $R_{wafer}$ and to the resistor $R_{sheath}$. A second terminal of the resistor $R_{wafer}$ is coupled to the first terminal of the capacitor $C_{SiO2}$ and to the first terminal of the resistor $R_{SiO2}$.

A voltage source $V_{plasmabias}$ having a positive terminal and a negative terminal is used to model a biasing effect produced by a plasma environment typical of a variety of semiconductor fabrication processes. The negative terminal of the voltage source $V_{plasmabias}$ is coupled to a power supply potential ground GND. The positive terminal of the voltage source $V_{plasmabias}$ is connected to the resistor $R_{sheath}$. A first terminal of the resistor $R_{sheath}$ is coupled to a first terminal of the resistor $R_{wafer}$ and to the second terminal of the resistor $R_{wafer\_base}$. A second terminal of the resistor $R_{sheath}$ is coupled to the positive terminal of the voltage source $V_{plasmabias}$. The resistor $R_{sheath}$ models the resistance of a plasma sheath in a plasma environment. Together, the voltage source $V_{plasmabias}$ and the resistor $R_{sheath}$ model the behavior of the plasma environment and its effect in the operation of the electrostatic chuck system 100. The voltage source $V_{plasmabias}$ is illustrated as having a potential of negative 50 volts. Skilled artisans will appreciate that the negative potential results in the terminal having the positive label is at a negative potential with respect to the supply potential GND. This labeling convention follows practice favored by skilled artisans and commonly employed in commercial circuit simulators. Furthermore, those skilled artisans will appreciate that the potential of negative 50 volts is representative of a typical operating condition associated with the presence of a plasma in the electrostatic chuck system 100. Other potentials, comprising both negative and positive values as well as zero volts, could be employed according to the specific processing conditions. For example, if the electrostatic chuck system were operated in a system having no plasma, e.g., in an ambient environment, then a potential of zero volts would be appropriate for $V_{plasmabias}$.

A second terminal of the resistor $R_{pole\text{-}pole}$ is coupled to a second terminal of the resistor $R_{esc}$, to a first terminal of a resistor $R_{cable\text{-}neg}$, and to a second terminal of the capacitor $C_{esc}$. The resistors $R_{cable\text{-}pos}$ and $R_{cable\text{-}neg}$ model resistances associated with positive and negative cable connections applying controlling potentials in the electrostatic chuck system 100. A second terminal of the resistor $R_{cable\text{-}pos}$ is coupled to a first terminal of a resistor $R_{filter\_pos}$ and to a circuit node Pos_Pole. A first terminal of a capacitor C2 is coupled to the power supply potential GND. A second terminal of the capacitor C2 is coupled to the second terminal of the resistor $R_{cable\text{-}pos}$, to the circuit node Pos_Pole, and to the first terminal of the resistor $R_{filter\_pos}$. A second terminal of the resistor $R_{filter\_pos}$ is coupled to a capacitor C4, to a first terminal of a resistor R1, and to a circuit node HV+. A first terminal of the capacitor C4 is coupled to the power supply potential GND, and a second terminal of the capacitor C4 is coupled to the second terminal of the resistor $R_{filter\_pos}$.

A second terminal of the resistor $R_{cable\text{-}neg}$ is coupled to a first terminal of a resistor $R_{filter\_neg}$, to a circuit node Neg_Pole, and to a first terminal of a capacitor C1. A second terminal of the capacitor C1 is coupled to the power supply potential GND. A second terminal of the resistor $R_{filter\_neg}$ is coupled to a first terminal of a capacitor C3, to a first terminal of a resistor R2, and to a circuit node HV−. A second terminal of the capacitor C3 is coupled to the power supply potential GND.

The resistors $R_{filter\_pos}$, $R_{filter\_neg}$, and capacitors C1, C2, C3, C4 will be familiar to those skilled in the art of circuit design as providing radio frequency (RF) bypass filters for shunting radio frequency signals to the circuit supply potential ground GND. Electrostatic chucks are often used in semiconductor processing equipment having a plasma generated by the application of radio frequency energy to a gas or gas mixture. An electrostatic chuck exposed to the plasma couples radio frequency energy to circuit elements (e.g., voltage sources) coupled to the electrostatic chuck. Therefore, it is common practice in physical systems to provide RF bypass filtering to shunt the RF energy to ground thereby preventing the RF energy from damaging circuit elements or creating a physical hazard. The RF bypass filters are also preferentially included into circuit simulations in order to permit modeling of their effect on the electrical performance of the system into which they are incorporated.

The electrostatic chuck system 100 further comprises a first voltage-controlled voltage supply V1 and a second voltage-controlled voltage supply V2. Voltage-controlled voltage supplies function as voltage amplifiers with a gain set by a potential associated with the supply and are a common feature in commercial circuit simulators known to those skilled in the art of circuit design and simulation. Each voltage-controlled voltage supply comprises a positive and a negative output terminal, indicated by the labels "+" and "−" respectively, within the circle symbol. In addition, each voltage-controlled voltage supply additionally has a positive and a negative control terminal, indicated by the labels "+" and "−" located outside the circle symbol on either of the left and right sides of the symbol. The second terminal of the resistor R1 is coupled to the positive output terminal of the first voltage-controlled voltage supply V1. The second terminal of the resistor R2 is coupled to the positive output terminal of the second voltage-controlled voltage supply V2. The negative output terminal of the first voltage-controlled voltage supply V1 is coupled to a resistor $R_{bias}$, to a circuit node Center_Tap, and to the negative output terminal of the second voltage-controlled voltage supply V2.

A voltage source $V_{bias}$ having a positive terminal and a negative terminal is used to model a control bias applied to the electrostatic chuck system. The negative terminal of the voltage source $V_{bias}$ is coupled to the power supply potential GND. The positive terminal of the voltage source $V_{bias}$ is coupled to a first terminal of the resistor $R_{bias}$. A second terminal of the resistor $R_{bias}$ is coupled to the circuit node Center_Tap, to the negative output terminal of the first voltage-controlled voltage source V1, and to the negative output terminal of the second voltage-controlled voltage source V2. The voltage source $V_{bias}$ and the resistor $R_{bias}$ model the effect of a constant bias potential applied to the electrostatic chuck. The voltage source $V_{bias}$ is illustrated as having a potential of negative 50 volts. Other values for the $V_{bias}$ potential are possible, analogous to the discussions made above with respect to $V_{plasmabias}$.

The negative control terminal of the first voltage-controlled voltage source V1 is coupled to the positive control terminal of the second voltage-controlled voltage source V2, to a first terminal of a resistor R4, and to a first terminal of a capacitor C5. A second terminal of the resistor R4 is coupled to the power supply potential GND. A second terminal of the capacitor C5 is coupled to the positive control terminal of the first voltage-controlled voltage source V1 and to the negative control terminal of the second voltage-controlled voltage source V2.

A voltage source $V_{fall}$ has a negative terminal coupled to the power supply potential GND. A positive terminal of the voltage source $V_{fall}$ is coupled to a negative terminal of a voltage source $V_{Drive}$. A positive terminal of the voltage source $V_{Drive}$ is coupled to the second terminal of the capacitor C5, to the positive control terminal of the first voltage-controlled voltage source V1, and to the negative control terminal of the second voltage-controlled voltage source V2. In simulations to be described below, the voltage sources $V_{fall}$ and $V_{Drive}$ are operated as piece-wise linear sources having time-varying potentials in order to simulate the actions of applying controlling voltages to the electrostatic chuck for the purpose of varying the adhesion between the semiconductor wafer and the electrostatic chuck.

Those skilled in the art will appreciate that the circuit nodes Pos Pole, Neg_Pole, HV+, HV−, and Center_Tap are labels employed as a convenience in the operation of circuit simulators to provide easily identifiable terminals for output of voltage potentials which may then be plotted or tabulated for further analysis.

Table I, shown below, summarizes the values employed for each of the resistive circuit elements described above, for a first exemplary embodiment of the present invention.

TABLE I

| Circuit Element | Value (ohms) |
| --- | --- |
| R1 | 50k |
| R2 | 50k |
| R4 | 50k |
| $R_{bias}$ | 3 Meg |
| $R_{cable-neg}$ | 1 Meg |
| $R_{cable-pos}$ | 1 Meg |
| $R_{esc}$ | 8 Meg |
| $R_{esc\ base}$ | 8 Meg |
| $R_{filter\ neg}$ | 250k |
| $R_{filter\ pos}$ | 250k |
| $R_{gap}$ | 100 Meg |
| $R_{gap\ base}$ | 100 Meg |
| $R_{gap-trapped}$ | 100 Meg |
| $R_{grain}$ | 100 Meg |
| $R_{pole-pole}$ | 150 Meg |
| $R_{sheath}$ | 1k |
| $R_{SiO2}$ | 1k |
| $R_{SiO2\ base}$ | 1k |
| $R_{wafer}$ | 100 |
| $R_{wafer\ base}$ | 100 |

Further, values for capacitive circuit elements in the first exemplary embodiment are summarized in Table II, below.

TABLE II

| Circuit Element | Value (Farads) |
| --- | --- |
| C1 | 470e−12 |
| C2 | 470e−12 |
| C3 | 1.1e−9 |
| C4 | 1.1e−9 |
| C5 | 1e−6 |
| $C_{esc}$ | 3e−9 |
| $C_{esc\ base}$ | 3e−9 |
| $C_{gap}$ | 10e−9 |
| $C_{gap\ base}$ | 10e−9 |
| $C_{SiO2}$ | 0.0021e−6 |
| $C_{SiO2\ base}$ | 0.0021e−6 |
| $C_{trapped}$ | 50e−9 |

Further, values for voltage source circuit elements in the first exemplary embodiment are summarized in Table III, below.

TABLE III

| Circuit Element | Value |
| --- | --- |
| V1 | 100 |
| V2 | 100 |
| $V_{bias}$ | −50 |
| $V_{Drive}$ | PWL (0 0 1.99 0 2.0 10 40 10) |
| $V_{fall}$ | PWL (0 0 19.7 0 20 −10 40 −10) |
| $V_{plasmabias}$ | −50 |

Those skilled in the art of circuit design and simulation will appreciate that the values associated with $V_{Drive}$ and $V_{fall}$ represent time-varying voltages in a notation commonly employed in SPICE circuit simulators. In particular, and by way of example, the notation associated with the voltage source $V_{Drive}$ is shorthand for the following voltage waveform description as detailed in Table IV, below.

TABLE IV

| Time (seconds) | Voltage Potential |
| --- | --- |
| (begin) | |
| 0 | 0 |
| 19.7 | 0 |
| 20 | −10 |
| 40 | −10 |
| (end) | |

For times which fall between those tabulated in Table IV, above, the SPICE circuit simulator performs a linear interpolation to compute a value for the voltage potential. Thus, the SPICE circuit simulator can associate a voltage value needed at any time required by a simulation. Configured according to Table III, the voltage sources $V_{Drive}$ and $V_{fall}$ simulate the application of a control bias initiating the clamping process between the substrate and the electrostatic chuck at a time of approximately two seconds, followed by the removal of the bias at approximately 20 seconds.

A skilled artisan will recognize that any of these parameters may be readily varied to suit particular situations. By incorporating the element values as tabulated in Tables I-III into a circuit simulator and executing a simulation by techniques known to skilled artisans, voltage and current values within the circuit may be determined as a function of time for the first exemplary embodiment.

Figure 2:
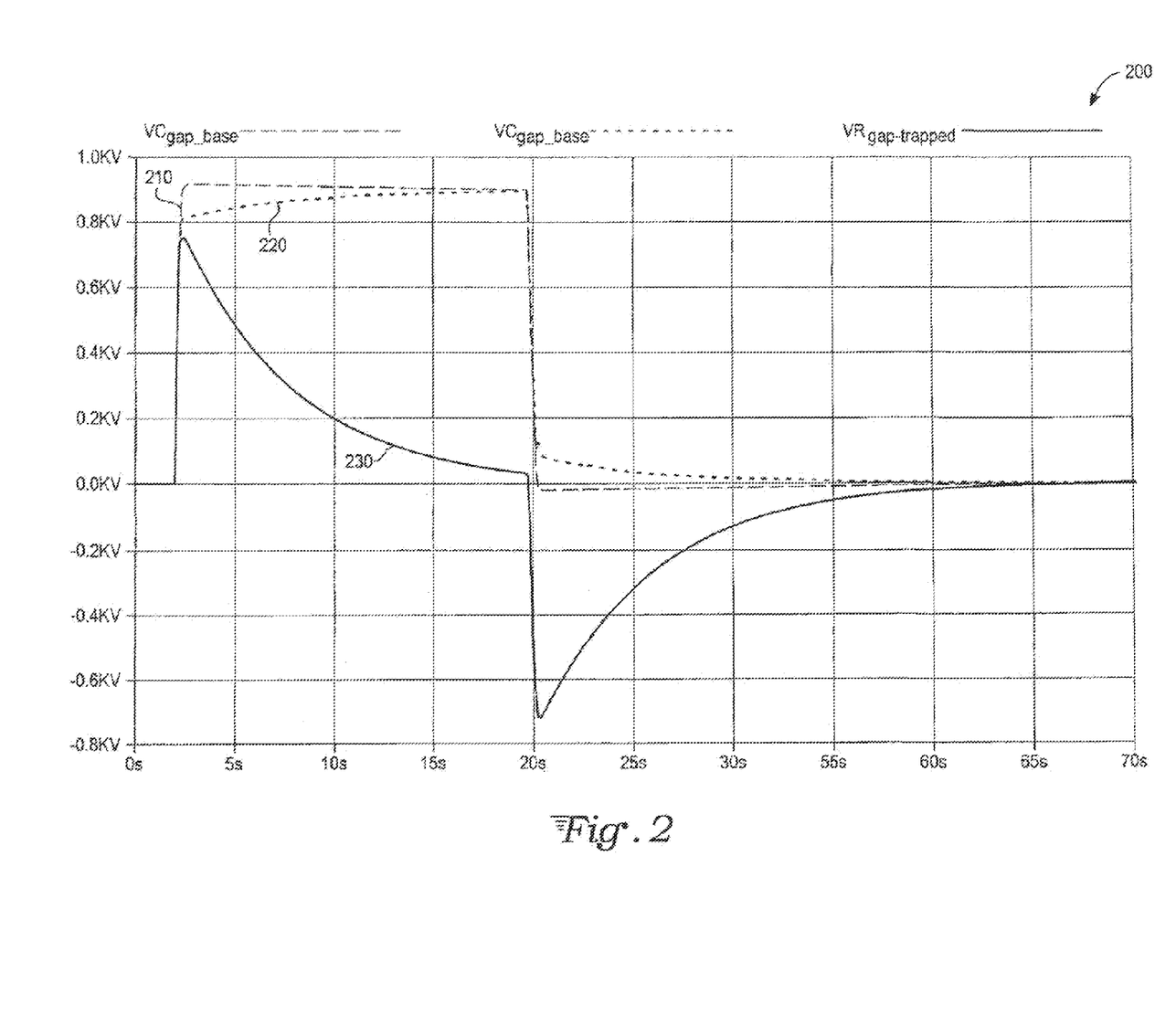
FIG. 2 is a simulated voltage vs. time plot for an exemplary electrostatic chuck system.

With continuing reference to FIG. 1, attention is now directed to FIG. 2 which provides a graphical representation of the circuit simulation results comprising a voltage versus time plot 200 including $VC_{gap\_base}$ time dependent voltage curve 210, $VC_{gap}$ a time dependent voltage curve 220, and a $VR_{gap-trapped}$ time dependent voltage curve 230. Skilled artisans will recognize that the notation "$VC_{gap}$" is a compact method of representing "the voltage potential across the terminals of circuit element $C_{gap}$." Similarly, the notations "$VC_{gap\_base}$" and "$VR_{gap\_trapped}$" represent voltage potentials across the terminals of circuit elements $C_{gap\_base}$ and $R_{gap\text{-}trapped}$, respectively. Those skilled artisans will further appreciate that the circuit simulator is capable of indicating the voltage at any node within a simulated circuit, and is additionally capable of indicating the current through any circuit element. The voltage and current values not presented are excluded to avoid obscuring the present invention.

The $VC_{gap\_base}$ time dependent voltage curve 210 is indicative of the voltage developed across the capacitor $C_{gap\_base}$, i.e., between the substrate and the electrostatic chuck in the absence of any charge trapped in the chuck itself. The curve shows a rapid rise in voltage at approximately two seconds into the simulation as a result of the bias applied by voltage source $V_{Drive}$ acting on voltage-controlled voltage sources V1 and V2. During the interval from approximately two seconds until approximately 20 seconds, the voltage indicated by the $VC_{gap\_base}$ time dependent voltage curve 210 stays relatively constant. Therefore, the substrate would consequently experience a comparatively constant adhesion to the electrostatic chuck. At a time of approximately 20 seconds, the control bias is removed and the curve drops rapidly to approximately zero. Consequently, the adhesive force between the substrate and the electrostatic chuck also drops rapidly.

The $VC_{gap}$ time dependent voltage curve 220 is indicative of the voltage developed across the capacitor $C_{gap}$, which is representative of a potential between a substrate and an electrostatic chuck when including the influence of trapped charge in the electrostatic chuck. The curve 220 shows a rise in voltage at approximately two seconds into the simulation as a result of the bias applied by voltage source $V_{Drive}$ acting on voltage-controlled voltage sources V1 and V2. In comparison with no trapped charge case represented by curve 210, the voltage rise for the trapped charge case curve 220 is less rapid. This shows that the adhesive force builds less rapidly when trapped charge is included in the electrostatic chuck model. During the interval from approximately two seconds until approximately 20 seconds, the voltage indicated by the $VC_{gap}$ time dependent voltage curve 220 continues to rise, until it approximately matches the $VC_{gap\_base}$ time dependent voltage curve 210 at a time of approximately 20 seconds. Thus, the simulation predicts that at approximately 20 seconds, the electrostatic chuck including the effect of trapped charge will have approximately the same chuck-to-substrate adhesive force as an electrostatic chuck without trapped charge. At approximately 20 seconds, the control bias is removed and the $VC_{gap}$ time dependent voltage curve 220 falls. Comparison between the curves 210 and 220 shows that the effect of the trapped charge in the electrostatic chuck is to slow the rate at which the potential $VC_{gap}$ returns toward zero. Consequently, the adhesive force between the substrate and the electrostatic chuck also drops less rapidly than for the case without trapped charge.

The $VR_{gap\text{-}trapped}$ time dependent voltage curve 230 illustrates the change in the potential across the gap-trapped resistor as the electrostatic chuck is biased. This potential may be used to interpret the charging and discharge of the trapped charge capacitor as the control bias is varied. The potential VRgap-trapped is also of interest because this potential is related to the electrostatic conditions at the wafer/electrostatic chuck interface and is responsible for wafer clamping and release processes. Examination of curve 230 shows that the potential $VR_{gap\text{-}trapped}$ rapidly increases at a time of approximately two seconds (as the control bias is applied), showing that the capacitor $C_{trapped}$ (i.e., the electrostatic chuck trapped charge) is charging. From approximately two seconds to approximately 20 seconds, the potential $VR_{gap\text{-}trapped}$ diminishes as to nearly zero, showing that the capacitor $C_{trapped}$ is nearly fully charged during this interval. At approximately 20 seconds, the control bias is removed and the potential $VR_{gap\text{-}trapped}$ becomes negative, indicating that the capacitor $C_{trapped}$ is discharging. By a time of approximately 40 to 50 seconds, the potential $VR_{gap\text{-}trapped}$ is nearly zero, indicating that the capacitor $C_{trapped}$ (i.e., the electrostatic chuck trapped charge) is nearly discharged.

Figure 3:
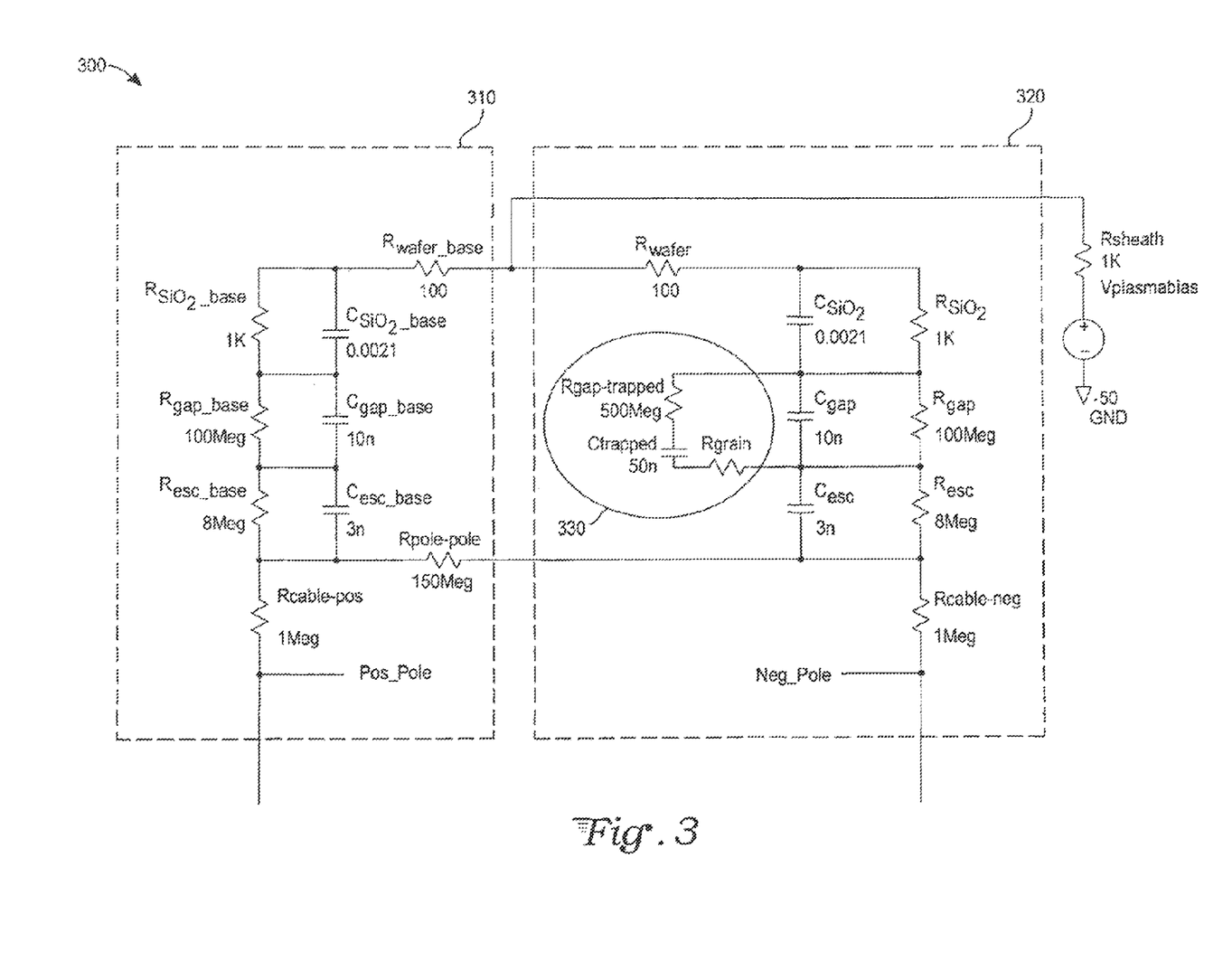
FIG. 3 is a circuit schematic for an electrostatic chuck subsystem used to model a reduced charge trap area.

Attention will now be called to FIG. 3, comprising an exemplary electrostatic chuck subsystem 300, having a subsystem baseline circuit portion 310 and a subsystem modified circuit portion 320. The subsystem modified circuit portion 320 includes a modified trapped charge RC model 330, illustrating a second embodiment of the present invention. The components of the electrostatic chuck subsystem 300 are analogous in function to those components in FIG. 1 having identical names. Further, the components of the electrostatic chuck subsystem 300 are analogous in electrical value to the values of the first exemplary embodiment, except for the components comprising the modified trapped charge RC model 330. The resistance associated with $R_{gap\text{-}trapped}$ in this second exemplary embodiment is 500 Meg ohms; this is five times larger than the value of 100 Meg ohms employed in the first exemplary embodiment. This larger resistance represents the anticipated effect of reducing the trapped charge area of the electrostatic chuck, e.g., by decreasing the size of the chuck to one-fifth of its previous area, and hence reducing the number of points of contact between the chuck and substrate. If appropriate materials data are available, it is also possible to alter the value of $C_{trapped}$ as the chuck geometry is altered The resistor $R_{grain}$, which appears in the trapped charge RC model 130 of FIG. 1, is not included in the modified trapped charge RC model 330. The exclusion of the resistor $R_{grain}$ models the electrical behavior of an electrostatic chuck in which the grain resistance is negligible. Skilled artisans will appreciate that an alternative to excluding the resistor $R_{grain}$ for this situation from the modified trapped charge RC model 330 is to set the electrical value of its resistance to a sufficiently low value to make its effect negligible, e.g., to one milli-ohm. Yet another alternative is to retain the resistor $R_{grain}$ in all simulations and to select a value for $R_{grain}$ appropriate to the physical situation being modeled, estimating for example, anticipated high and low extremes.

By incorporating the modified element values for the electrostatic chuck subsystem 300, as explained above, into the circuit simulator and again executing a simulation, voltage and current values within the circuit may be determined as a function of time for the second exemplary embodiment.

Figure 4:
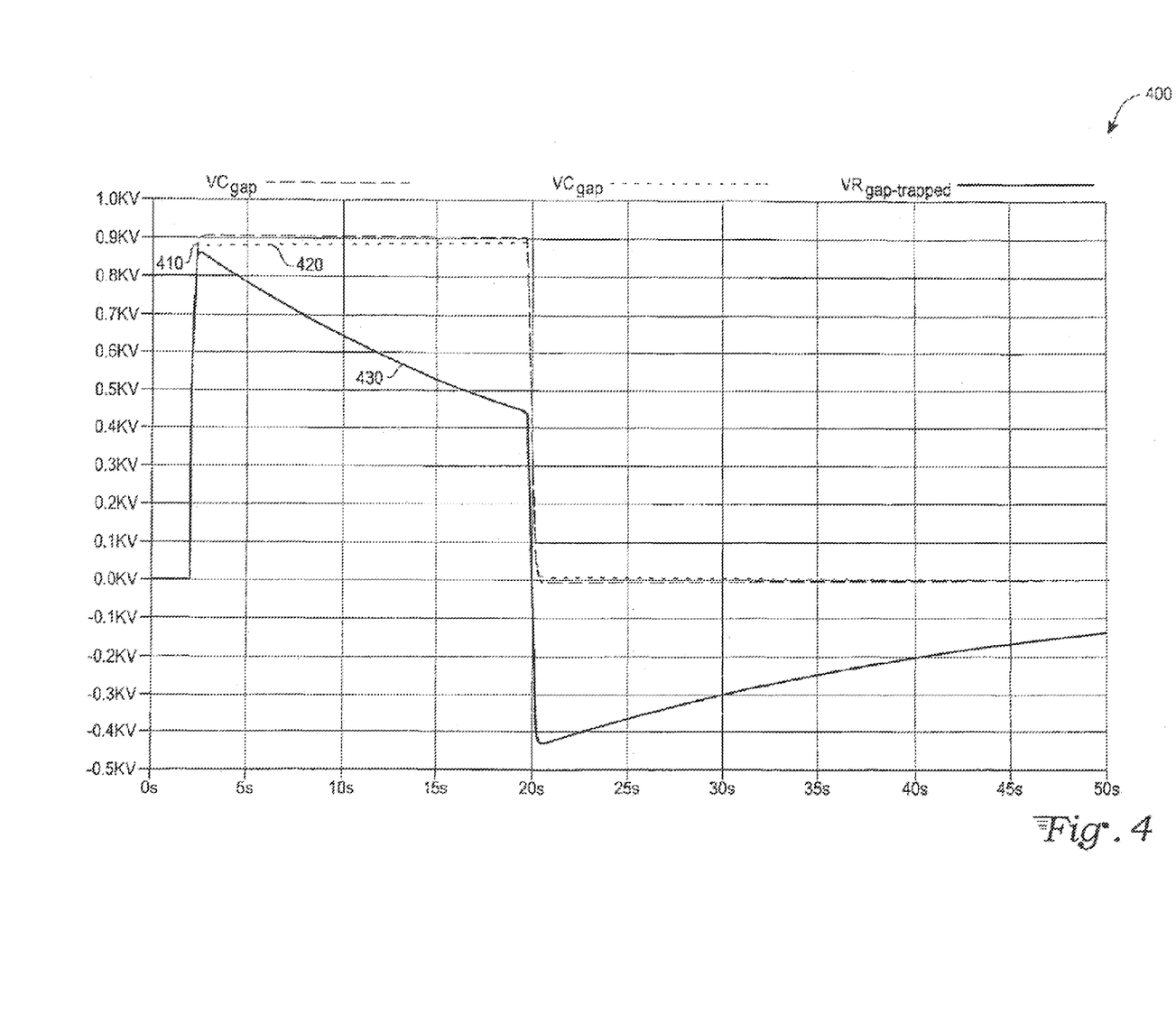
FIG. 4 is a simulated voltage vs. time plot for an electrostatic chuck system with a reduced charge trap area.

With reference to FIG. 4, a graphical representation of the circuit simulation results comprising a modified trapped charge voltage versus time plot 400 including modified trapped charge $VC_{gap\_base}$ time dependent voltage curve 410, a modified trapped charge $VC_{gap}$ time dependent voltage curve 420, and a modified trapped charge $VR_{gap\text{-}trapped}$ time dependent voltage curve 430.

The modified trapped charge $VC_{gap\_base}$ time dependent voltage curve 410 is indicative of the voltage developed across the capacitor $C_{gap\_base}$, i.e., between the substrate and the electrostatic chuck in the absence of any charge trapped in the chuck itself. Examination of this curve and comparison with the $VC_{gap\_base}$ time dependent voltage curve 210 shows that the two results are comparable. This is to be expected as both results are associated with equivalent circuit portions representing the operation of an electrostatic chuck without any effect of trapped charge.

The modified trapped charge $VC_{gap}$ time dependent voltage curve 420 is indicative of the voltage developed across the capacitor $C_{gap}$, which is again representative of the potential between a substrate and an electrostatic chuck when including the influence of the modified trapped charge in the electrostatic chuck. Comparison of the curve 420 with the curve 220 shows how the modification of the electrostatic chuck trapped charge changes the performance of the electrostatic chuck. In comparison with the trapped charge case of the first embodiment, represented by the curve 220, the voltage rise for the modified trapped charge case curve 420 is more rapid. This shows that the adhesive force builds more rapidly when trapped charge is reduced in the electrostatic chuck model. During the interval from approximately two seconds until approximately 20 seconds, the voltage indicated by the $VC_{gap}$ time dependent voltage curve 420 closely approximates the modified trapped charge $VC_{gap\_base}$ time dependent voltage curve 410. At approximately 20 seconds, the control bias is removed and the modified trapped charge $VC_{gap}$ time dependent voltage curve 420 falls. Comparison between the curves 410 and 420 shows that the reduced trapped charge case more closely approximates the condition of an electrostatic chuck having no trapped charge. Consequently, the adhesive force between the substrate and the electrostatic chuck drops rapidly for the case having modified trapped charge.

The modified trapped charge $VR_{gap-trapped}$ time dependent voltage curve 430 illustrates the change in the potential across the gap-trapped resistor as the electrostatic chuck is biased. Examination of the curve 430 shows that the potential $VR_{gap-trapped}$ rapidly increases at a time of approximately two seconds (as the control bias is applied), showing that the capacitor $C_{trapped}$ (i.e., the electrostatic chuck trapped charge) is charging. From approximately two seconds to approximately 20 seconds, the potential $VR_{gap-trapped}$ diminishes, but remains substantially above zero, indicating that the capacitor $C_{trapped}$ continues to charge during this interval. At approximately 20 seconds, the control bias is removed and the potential $VR_{gap-trapped}$ becomes negative, indicating that the capacitor $C_{trapped}$ is discharging. At a time of approximately 40 to 50 seconds, the potential $VR_{gap-trapped}$ is clearly negative, indicating that the capacitor $C_{trapped}$ (i.e., the electrostatic chuck trapped charge) is continuing to discharge. Thus, the curve 430 indicates that the increased resistance associated with a reduction in an electrostatic chuck area will slow the rate at which trapped charge in the chuck equilibrates following changes in control bias potential. This information may be beneficially applied to modifications of an electrostatic chuck design.

For example, if it is desired to have the chuck respond rapidly to changes in a control bias, the area of the chuck could be increased to reduce $R_{gap-trapped}$. Alternately, if it is desirable to maintain adhesion for as long as possible after a control bias is removed, the electrostatic chuck area could be decreased, thereby increasing $R_{gap-trapped}$. Skilled artisans will appreciate that it is also possible to include effects relating to other physical parameters such as dielectric constant and grain size in order to control various aspects of the electrostatic chuck performance.

In the foregoing specification, the present invention has been described with reference to specific embodiments thereof. It will, however, be evident to a skilled artisan that various modifications and changes can be made thereto without departing from the broader spirit and scope of the present invention as set forth in the appended claims. For example, although a method of the present invention is described primarily in reference to the simulation of the electrical behavior of an electrostatic chuck, skilled artisans will appreciate that the present invention may also be practiced with an actual circuit, and that principles embodied in the present invention may be beneficially applied to the design and operation of actual electrostatic chucks. For example, in a physical implementation of an electrostatic chuck using principles of the present invention, a movable electrode may be employed to apply a control bias to a substrate in place of a time-varying voltage source used in a simulation. The specification and drawings are, accordingly, to be regarded in an illustrative rather than a restrictive sense.

What is claimed is:

1. A method of using a circuit simulator to simulate an effect of trapped charge in an electrostatic chuck on the electrostatic chuck performance, the method comprising:
    creating a trapped-charge electrical model by coupling a trapped charge capacitor to a gap-trapped resistor and to a grain resistor;
    selecting a capacitance value $C_{trapped}$ for the trapped charge capacitor;
    selecting a resistance value $R_{gap-trapped}$ for the gap-trapped resistor;
    selecting a resistance value $R_{grain}$ for the grain resistor;
    creating an electrostatic chuck simulation circuit by coupling a substrate-to-chuck interface gap capacitor with a substrate-to-chuck interface gap resistor, a substrate resistor, at least one cable resistor, and a plurality of voltage sources;
    configuring at least one of the plurality of voltage sources to provide a time-varying voltage;
    coupling the trapped-charge electrical model with the electrostatic chuck simulation circuit; and
    executing a first simulation in the circuit simulator to determine time-varying voltage and currents responses within a plurality of circuit nodes in the electrostatic chuck simulation circuit.

2. The method of claim 1 wherein the step of creating a trapped-charge electrical model by coupling a trapped charge capacitor to a gap-trapped resistor, and to a grain resistor is performed by connecting a terminal of the gap-trapped resistor to a first terminal of the trapped-charge capacitor and by further connecting a terminal of the grain resistor to a second terminal of the trapped-charge capacitor.

3. The method of claim 1, further comprising:
    optionally varying any of the capacitance value $C_{trapped}$, the resistance value $R_{gap-trapped}$, and the resistance value $R_{grain}$ in relation to a plurality of electrostatic chuck physical parameters followed by executing a second simulation to determine changes in the time-varying voltage and current responses.

4. The method of claim 1, further comprising:
    selecting a capacitance value $C_{gap}$ for the substrate-to-chuck interface gap resistor;
    selecting a resistance value $R_{gap}$ for the substrate-to-chuck interface gap capacitor;
    selecting a resistance value $R_{wafer}$ for the substrate resistor; and
    selecting a resistance value $R_{cable}$ for at least one cable resistor.

5. The method of claim 1, further comprising:
    configuring one of the plurality of voltage sources to provide a bias voltage simulating a plasma potential; and
    connecting a sheath resistor in series with the voltage source configured to provide a bias voltage simulating a plasma potential.

6. The method of claim 1, wherein:
    the step of selecting a capacitance value $C_{trapped}$ uses a capacitance approximately equal to 50 nanoFarads;

the step of selecting a resistance value $R_{gap\text{-}trapped}$ uses a resistance range from approximately 100 Megohms to 500 Megohms; and the step of selecting a resistance value $R_{grain}$ uses a resistance range from approximately zero to 200 Megohms.

7. The method of claim 1 further comprising:
adding a plurality of resistors and capacitors to the electrostatic chuck simulation circuit;
selecting a capacitance value $C_{gap}$ for at least one added capacitor;
selecting a resistance value $R_{gap}$ for at least one added resistor;
selecting a resistance value $R_{wafer}$ for at least another added resistor; and
configuring the plurality of added resistors and capacitors so as to simulate an electrostatic chuck without trapped charge.

8. A circuit to measure an effect of trapped charge in an electrostatic chuck system on the chuck performance, the circuit comprising:
an electrostatic chuck circuit portion comprising:
a substrate-to-chuck interface gap capacitance $C_{gap}$ coupled to a substrate-to-chuck interface gap resistance $R_{gap}$, a substrate resistance $R_{wafer}$, at least one cable resistance $R_{cable}$, and a trapped-charge circuit portion having a capacitance $C_{trapped}$, a resistance $R_{gap\text{-}trapped}$, and a resistance $R_{grain}$; and
a plurality of voltage sources, at least one of the plurality of voltage sources being capable of varying a voltage output as a function of time, the plurality of voltage sources coupled to the electrostatic chuck circuit portion.

9. The circuit of claim 8, wherein the trapped charge circuit portion further comprises a first terminal of the capacitance $C_{trapped}$ connected to a terminal of the resistance $R_{gap\text{-}trapped}$ and a second terminal of the capacitance $C_{trapped}$ connected to a terminal of the resistance $R_{grain}$.

10. The circuit of claim 8 wherein the trapped-charge circuit portion comprises an electrostatic chuck.

11. The system of claim 8, wherein the electrostatic chuck circuit portion is comprised of a substrate placed on an electrostatic chuck.

12. The system of claim 8, wherein at least one of the plurality of voltage sources is further coupled to an electrical filter for isolating a voltage source from radio frequency (RF) energy.

13. A method of designing an electrostatic chuck, the method comprising:
building in a circuit simulator a circuit model for the electrical behavior of the electrostatic chuck using an RC trapped-charge model;
coupling the circuit model to a plurality of voltage sources;
simulating the circuit model with the circuit simulator to determine voltage potentials at a plurality of circuit nodes and further to determine currents within a plurality of circuit components;
varying the circuit model in relation to changes in physical parameters of the electrostatic chuck; and
simulating the circuit with the circuit simulator to determine changes produced by varying the circuit model.

14. The method of claim 13 wherein the step of using an RC trapped-charge model is performed by connecting a resistor $R_{gap\text{-}trapped}$, a capacitor $C_{trapped}$, and a resistor $R_{grain}$, in a series configuration.

15. The method of claim 13 wherein the step of varying the circuit model in relation to changes in physical parameters of the electrostatic chuck is performed by varying a gap-trapped resistance.

16. A system for controlling an electrostatic chuck comprising:
voltage-controlled voltage source means for providing a time-varying bias to the electrostatic chuck in proportion to a time-varying controlling voltage, the time-varying bias for controlling a substrate to chuck adhesion according to simulation results from a charge-trapped circuit model;
time-varying voltage means for providing the time-varying controlling voltage;
dc bias means for applying a dc bias to the electrostatic chuck; and
cable means coupling the electrostatic chuck, the voltage-controlled voltage source means, the time-varying voltage source means, and the dc bias means.

17. The system of claim 16, further comprising:
filter means for isolating any of the voltage-controlled voltage source means, the time-varying voltage source means, and the dc bias means, from radio frequency energy coupled to the electrostatic chuck; and
additional cable means coupling the filter means to the voltage source means.

* * * * *